United States Patent
Liang

(10) Patent No.: US 7,125,272 B1
(45) Date of Patent: Oct. 24, 2006

(54) MODULAR CASE HANDLE POSITIONING DEVICE

(75) Inventor: Chien-Fa Liang, Chung-Ho (TW)

(73) Assignee: Super Micro Computer, Inc., San Jose, CA (US)

( * ) Notice: Subject to any disclaimer, the term of this patent is extended or adjusted under 35 U.S.C. 154(b) by 0 days.

(21) Appl. No.: 11/319,452

(22) Filed: Dec. 29, 2005

(51) Int. Cl.
*H01R 13/62* (2006.01)

(52) U.S. Cl. ..................................... 439/160; 361/732

(58) Field of Classification Search ............... 439/372, 439/160, 157, 153, 64, 353, 352, 155, 354, 439/358, 321, 630; 361/732, 726, 747, 759, 361/725, 798, 683, 728, 801–802, 754, 740
See application file for complete search history.

(56) References Cited

U.S. PATENT DOCUMENTS

| | | | | |
|---|---|---|---|---|
| 4,632,588 A | * | 12/1986 | Fitzpatrick | 403/16 |
| 4,975,073 A | * | 12/1990 | Weisman | 439/157 |
| 5,309,325 A | * | 5/1994 | Dreher et al. | 361/754 |
| 6,494,729 B1 | * | 12/2002 | Stathopoulos et al. | 439/160 |
| 6,916,190 B1 | * | 7/2005 | Joist | 439/160 |

* cited by examiner

*Primary Examiner*—Truc T. Nguyen
*Assistant Examiner*—Edwin A. Leon
(74) *Attorney, Agent, or Firm*—Lowe Hauptman & Berner, LLP

(57) ABSTRACT

A modular case handle positioning device including: the handles are able to angular rotate about the respective shaft pins as axis, and a force is applied to protruding portions of slots on two sides when the handles are rotated through an angle, thereby enabling the modular case to be withdrawn from the slots using a first stage displacement action. In order to prevent the entire modular case from falling to the ground because of an overexertion of force when the modular case is being inserted into the slots, the present invention includes a second stage displacement action that acts as a force buffer and final directional displacement control, thereby enabling the modular case to be solidly positioned within the slots.

4 Claims, 9 Drawing Sheets

MODULAR CASE HANDLE POSITIONING DEVICE

BACKGROUND OF THE INVENTION (a) Field of the Invention

The present invention relates to a modular case handle positioning device that uses rotational displacement of handles to control the moment of force and displacement direction of a modular case when being inserted into or withdrawn from an outer case slot, thereby preventing the modular case from falling to the ground when withdrawing from the slot and increasing position fixing accuracy and stability when inserting into the slot.

(b) Description of the Prior Art

The range of functions of computers is increasing with each passing day, for instance, various new functional devices are continually being developed in the area of industrial computers, such as remote controls, supervisory systems, loading of working data, updating, and so on, which all need the installation of new hardware, and the outer cases of these hardware components are all modularized as rectangular cases. However, these rectangular cases have a plurality of different sizes, and when the modular case is inserted into or withdrawn from holding slots, the modular case often falls to the ground because of an overexertion in the initial application of force by an operator (such as a pulling force) or overexertion of pressure when inserting the modular case into the holding slots results in an excessive vibration force between the modular case and the holding slots, finally resulting in an extremely large vigorous force being needed to re-withdraw the modular case from the tight fitting formed in the holding slots. The shortcomings of prior art are as described above.

Furthermore, screw connection methods are generally used to fix position of the modular case within the holding slots, which are extremely inconvenient to assemble and disassemble.

SUMMARY OF THE INVENTION

The primary objective of the present invention is to provide a modular case handle positioning device that uses angular rotation of handles to apply a force to protruding portions of slots on two sides, thereby enabling a modular case to be withdrawn from the slots using a first stage displacement action. In order to prevent the entire modular case from falling to the ground because of an overexertion of force when the modular case is being inserted into the slots, the present invention includes a second stage displacement action that acts as a force buffer and final directional displacement control, thereby enabling the modular case to be solidly positioned within the slots.

To enable a further understanding of said objectives and the technological methods of the invention herein, brief description of the drawings is provided below followed by detailed description of the preferred embodiments.

DETAILED DESCRIPTION OF THE PREFERRED EMBODIMENTS

Figure 1:
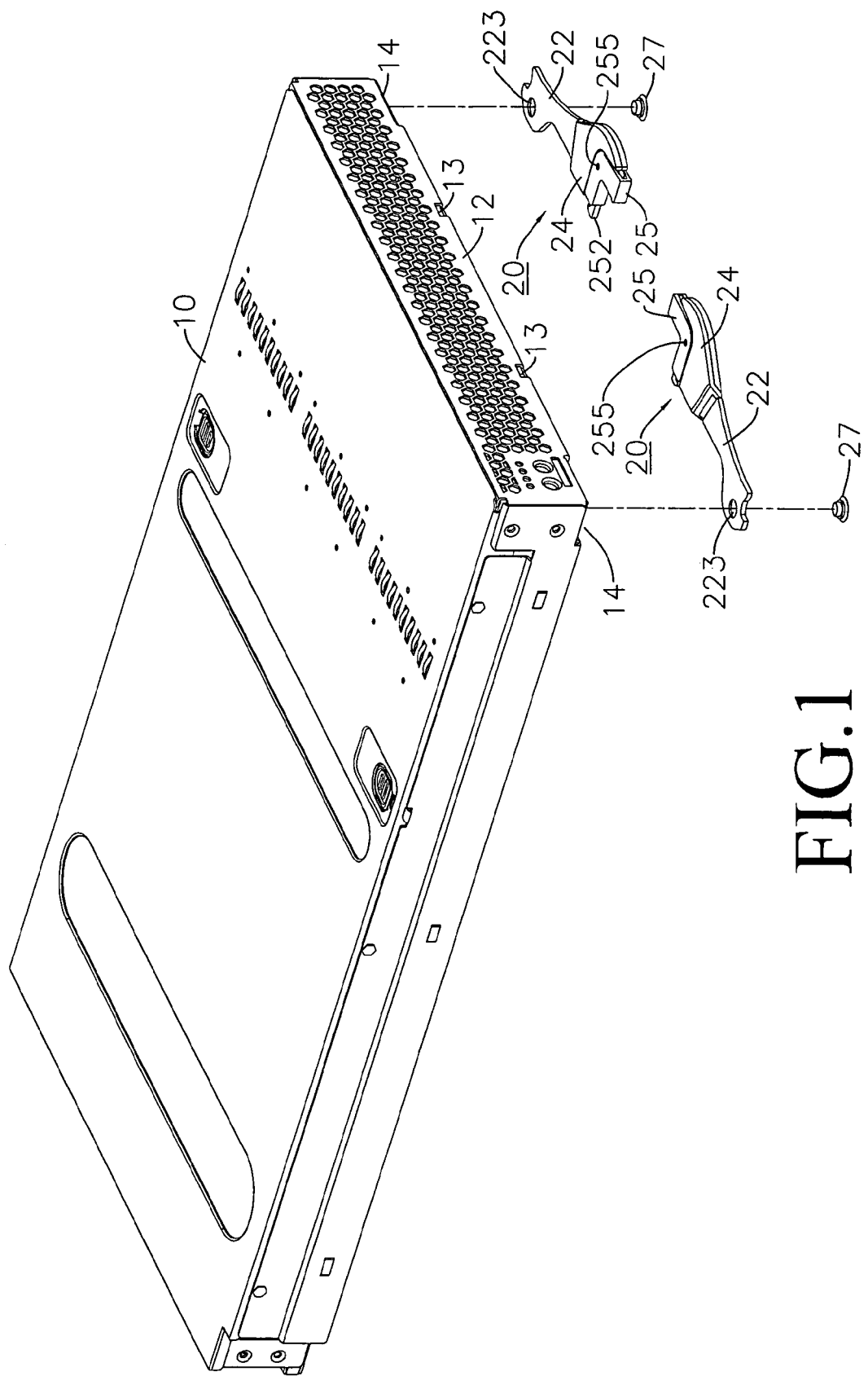
FIG. 1 shows an exploded elevational view of a modular case and handles according to the present invention.

Referring to FIGS. 1, 2, 3 and 4, the present invention provides the modular case handle positioning device, which comprises:

a rectangular modular case 10, wherein undersides of a front surface 12 is defined with depressed indentations 14, (14), each of which are provided with an inner groove surface 141, and an underside of the front face is defined with position fixing holes 13;

at least more than one handle 20, (20) is movable connected to a lower surface of two sides of the modular case 10, and each of the handles 20, (20) are structured to comprise:

a platelike main body 22 (see FIG. 3), wherein an upper cover 24 is affixed to an upper surface of a front plate 221, and a lower cover 26 is affixed to a lower surface, moreover, a front pivot joint hole 222 is defined in the front plate 221, and a rear pivot joint hole 223 is defined in a rear side of the main body 22; a side edge of the front plate 221 forms an L-shaped side 224;

an L-shaped linkage 25, a horizontal side of which forms a holding slot 251, a side end forms a hook 252, and a longitudinal through hole 253 is defined in the L-shaped linkage 25; the holding slot 251 fits into the L-shaped side 224, and a shaft pin 255 is inserted into the longitudinal through hole 253 and the front pivot joint hole 222 of the main body 22; the L-shaped linkage 25 is able to angular swing on the front plate 221 around the shaft pin 255 as axis;

the shaft pin 27 passes through the rear pivot joint hole 223 and into the inner groove surface of the indentation 14, and angular displacement of the handle 20 is made around the shaft pin 27 as axis, and the hook 252 clasps onto or separates from the position fixing hole 13.

Figure 3:
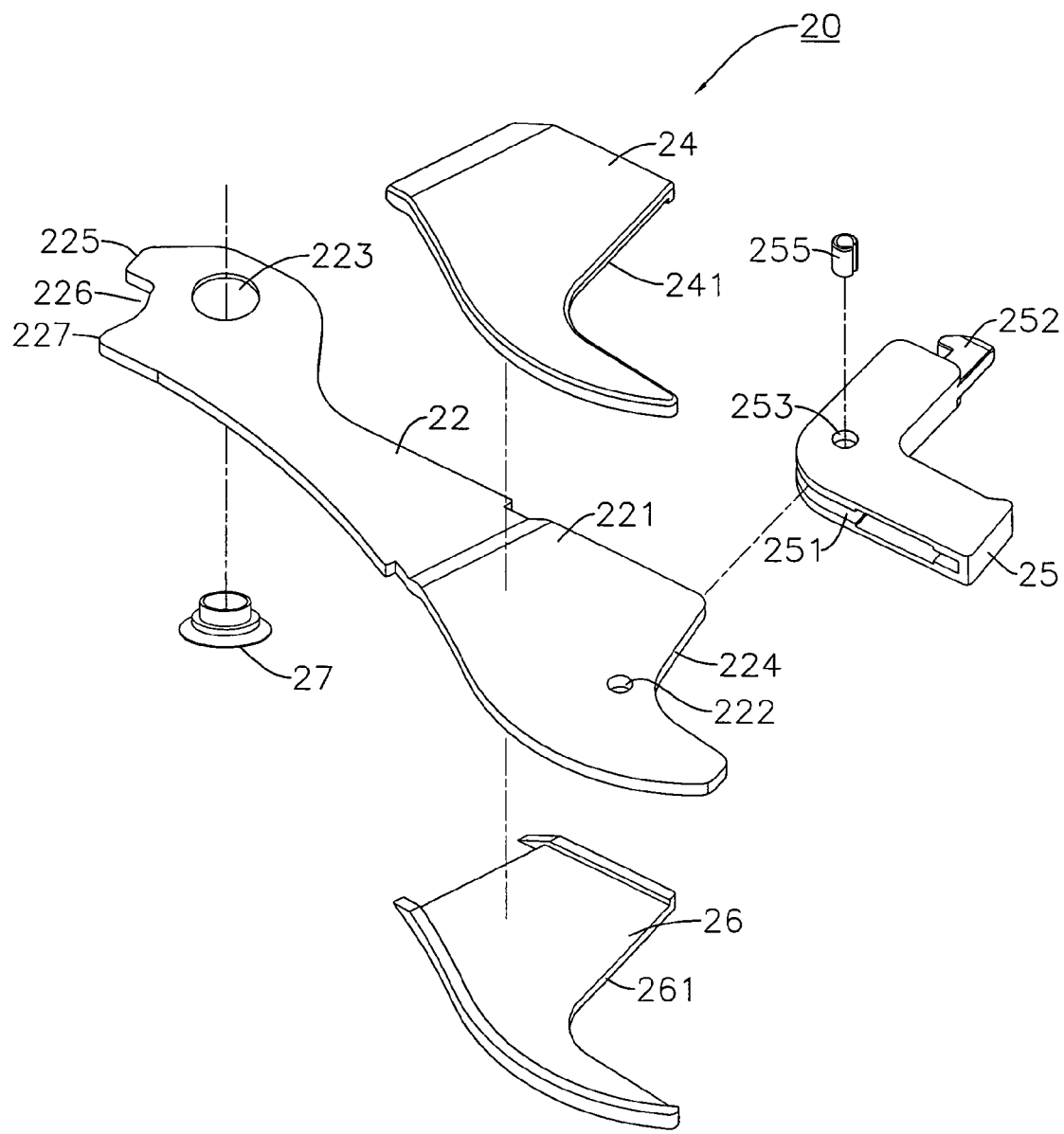
FIG. 3 shows an exploded view depicting components of the handle according to the present invention.
Figure 4:
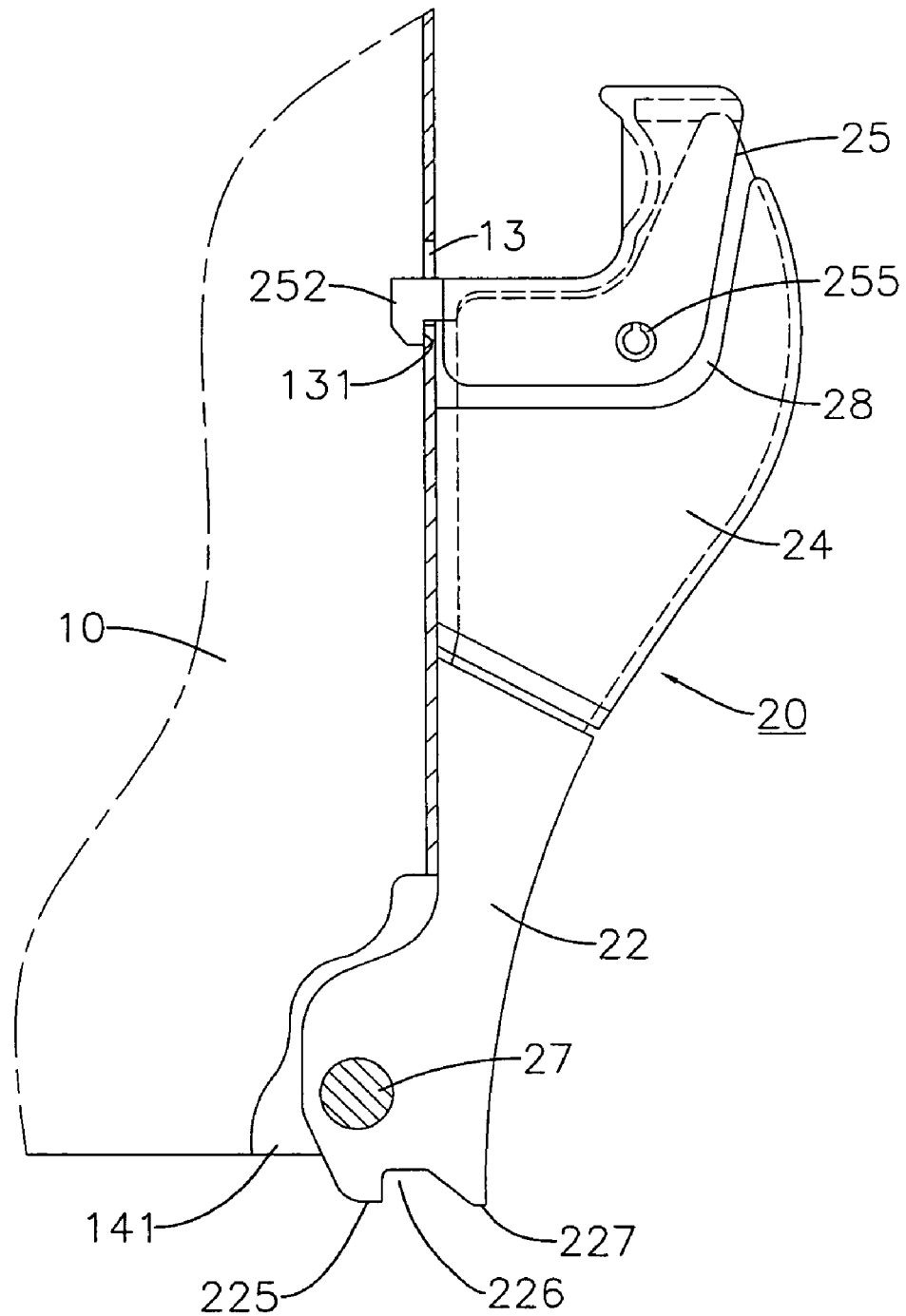
FIG. 4 shows a partial side view depicting the handle folded back and locked onto the modular case according to the present invention.
Figure 5:
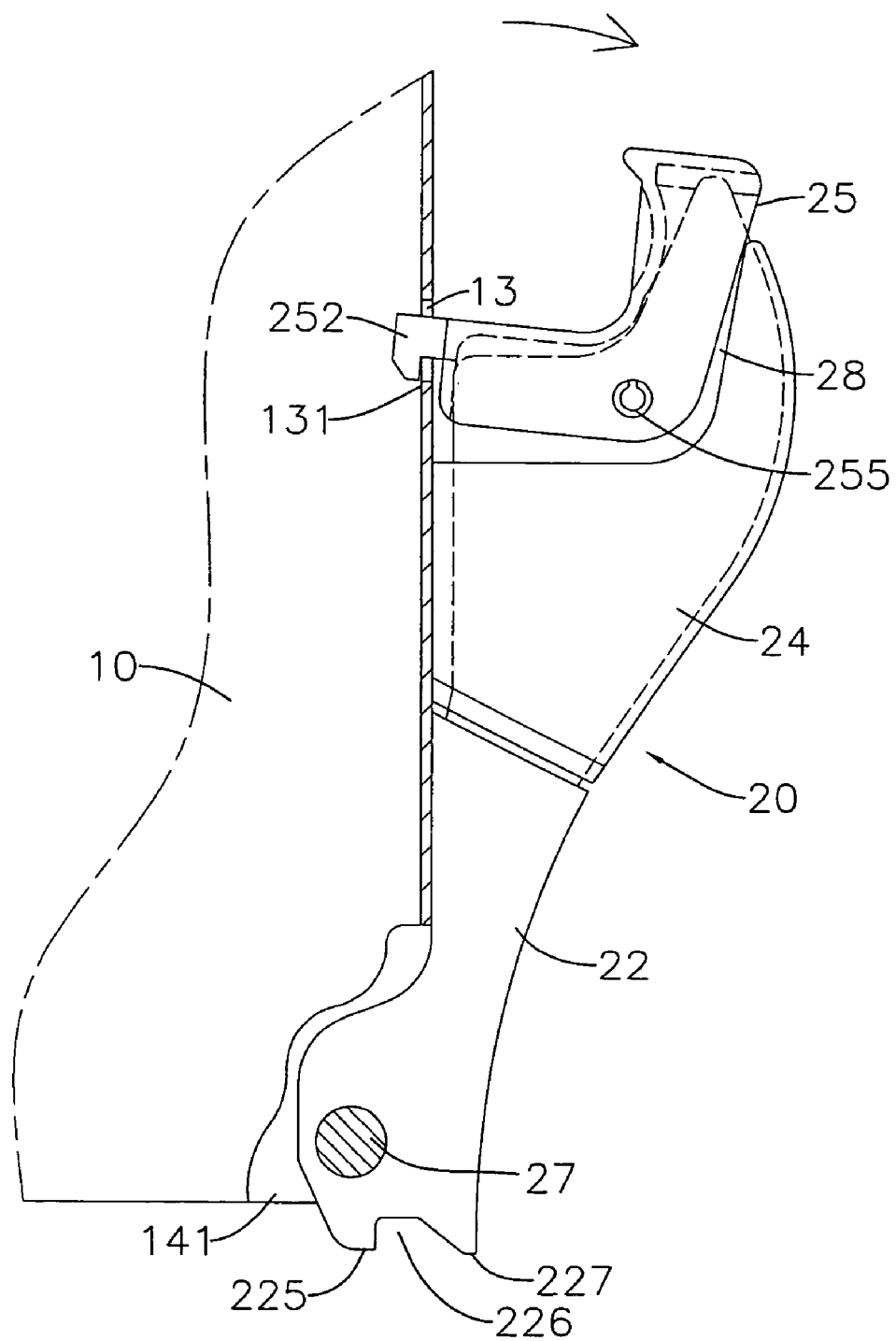
FIG. 5 shows a partial side view depicting the handle opening from the modular case according to the present invention.

Referring to FIGS. 3, 4 and 5, wherein sides of the upper cover 24 and the lower cover 26 form L-shaped sides 241 and 261 respectively. The two L-shaped sides 241, 261 correspond to a side of the L-shaped linkage 25, and an L-shaped clearance 28 is formed between the L-shaped sides 241, 261 and the L-shaped linkage 25.

Referring again to FIG. 4, wherein a surface of an inner wall 131 of the position fixing hole 13 enables the hook 252 to clasp thereon.

Figure 7:
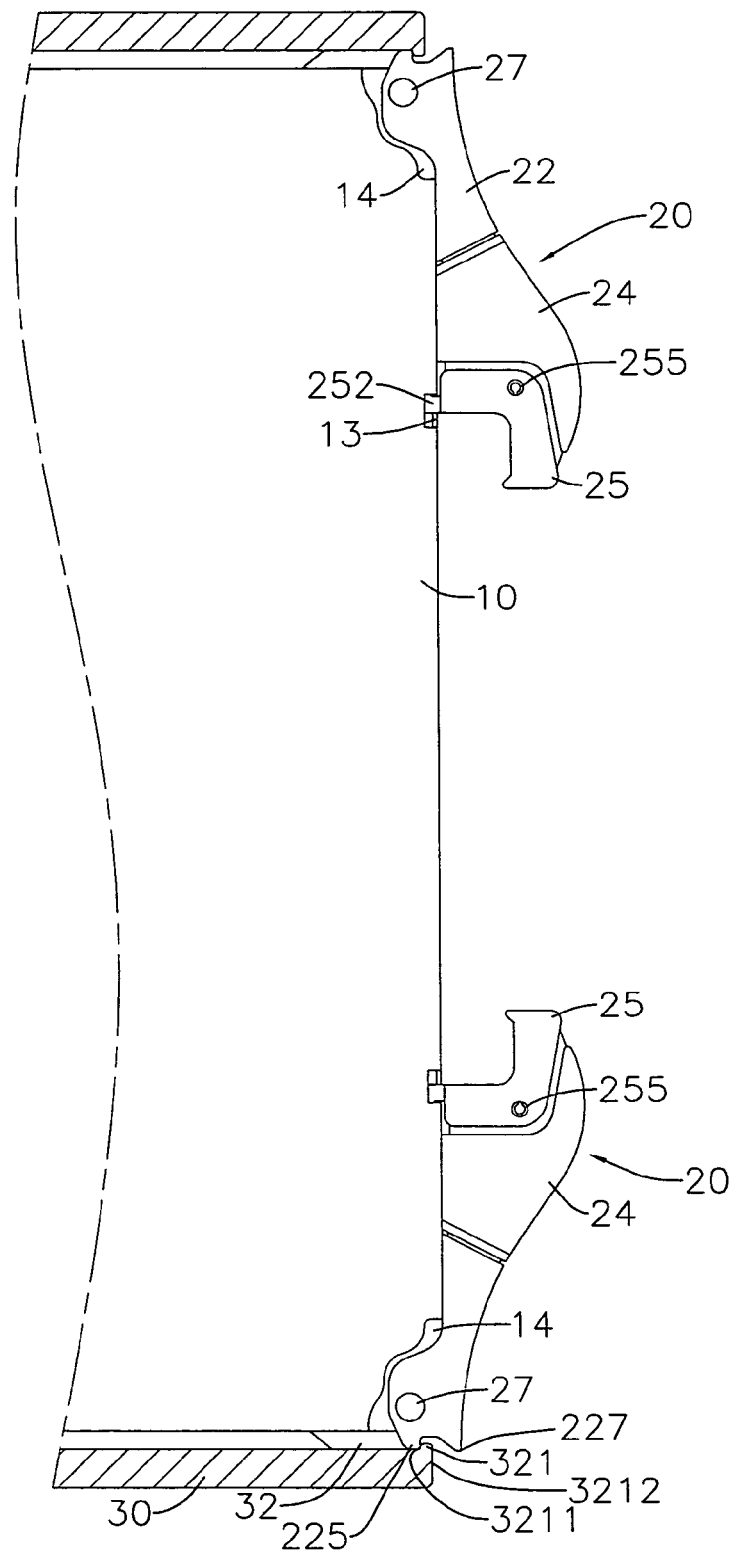
FIG. 7 shows a partial cross-sectional schematic view depicting the modular case assembled in slots of a host outer case according to the present invention.
Figure 8:
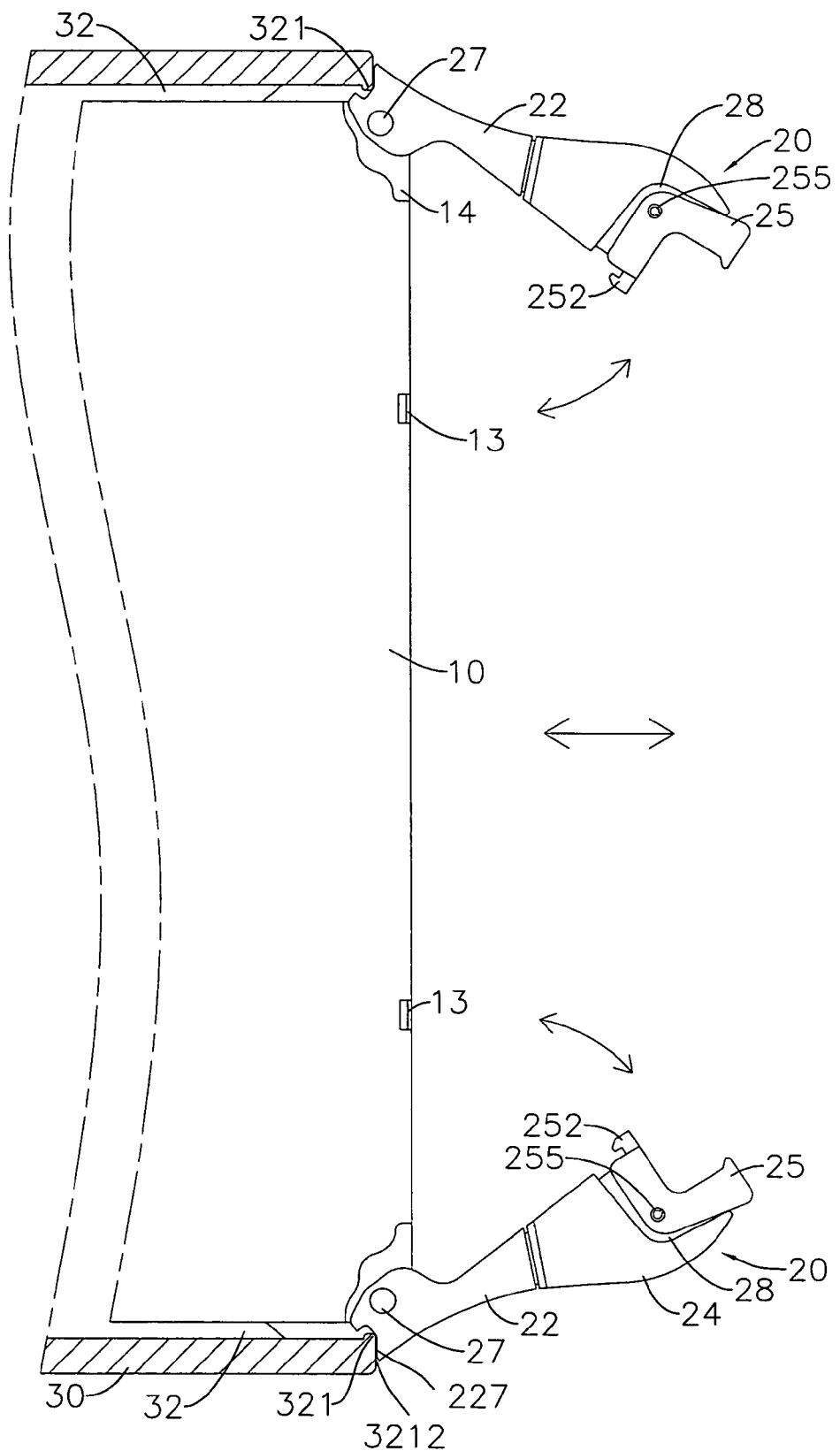
FIG. 8 shows a partial cross-sectional schematic view depicting the modular case being withdrawn from the slots of the host outer case according to the present invention.

Referring to FIGS. 7 and 8, wherein the rectangular modular case 10 is inserted into the slots 32 defined in an outer case 30, and protruding portions 321 are formed on slot ends of the slots 32 on two sides.

A protrusion 225 is formed at a rear end of the main body 22 of the handle 20, a side of the protrusion 225 forms an indentation 226 (see FIG. 3), a side of which forms an inclined surface 227. The protrusion 225 clasps onto or separates from an inner wall surface 3211 of each of the protruding portions 321, and the inclined surface 227 clasps onto or separates from an outer wall surface 3212 of each of the protruding portion 321 (see FIG. 8).

Referring to FIG. 1, which shows a preferred embodiment of the present invention comprising two handles 20 connected to a modular case 10. A rear end of a main body 22 of each of the handles 20 is movable connected to an inner groove surface 141 within an indentation 14 (14). The handles 20 are configured for rotational displacement through a certain angle in a positive or negative direction around a shaft pin 27 as axis.

Figure 2:
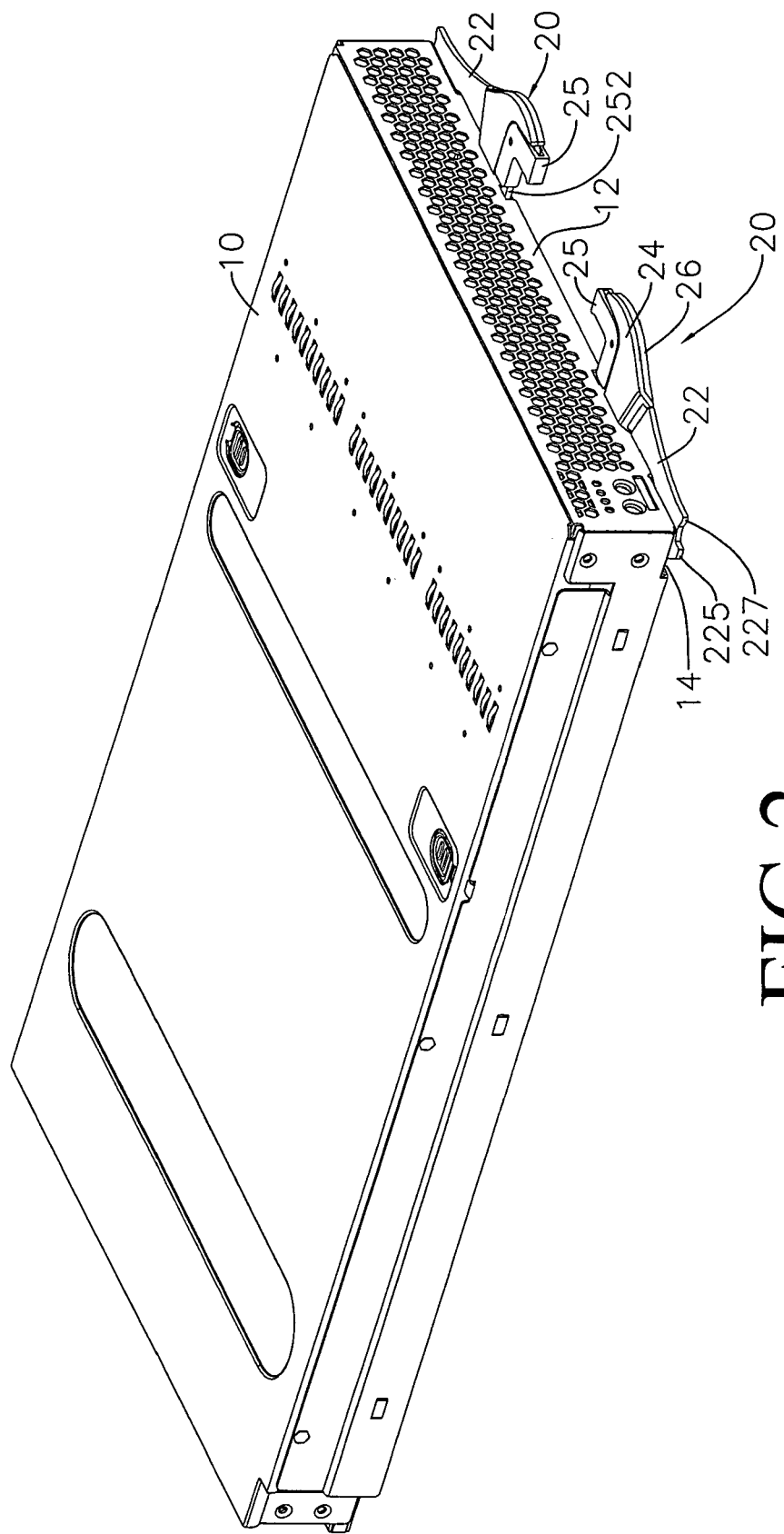
FIG. 2 shows an assembled elevational view of the modular case and handles according to the present invention.

Referring to FIG. 2, which shows a three-dimensional view of the present invention depicting the two handles 20 folded back and clamped to the modular case 10.

Referring to FIG. 4, which shows the two handles 20 locked onto the modular case 10, wherein a hook 252 of each handle clasps onto the surface of an inner wall 131 of a position fixing hole 13.

FIG. 5 shows a view of the handles 20 in the initial stages of being opened whereby an operator presses a linkage 25 of each of the handles 20 with his fingers to cause it to rotate through an angle around the shaft pin 255 as axis. Rotational displacement of the linkage 25 closes an outer open end of a clearance 28, thereby forming a angular displaced top dead point and simultaneously causing rotationally displacement of the hook 252, which results in the hook 252 separating from the inner wall 131 and being positioned within the position fixing hole 13. The operator holds the linkages 25 and an upper and a lower cover 24, 26 of each of the handles 20 and outwardly pulls on them as a single entity with his fingers.

Figure 6:
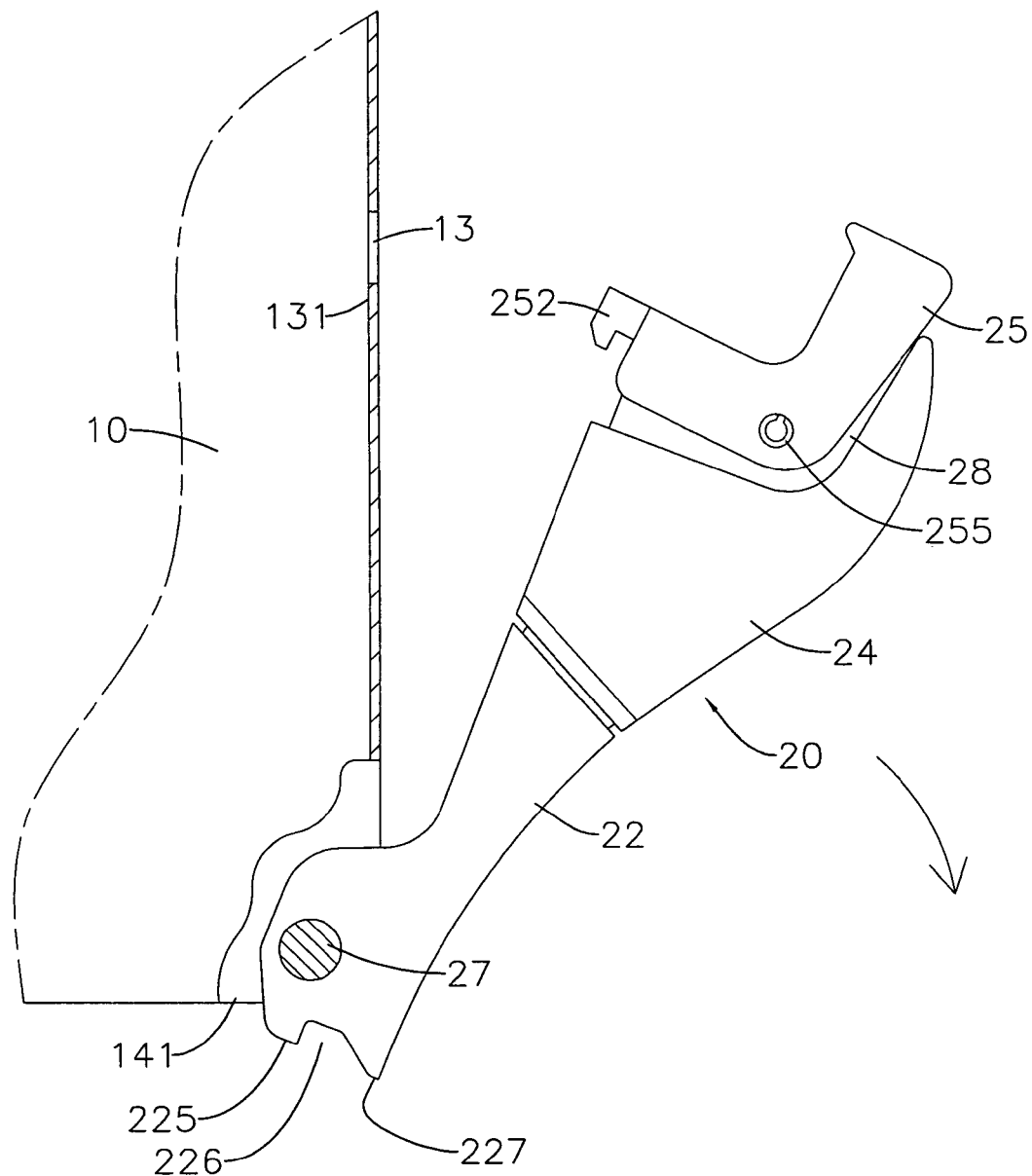
FIG. 6 shows a partial side view depicting the handle further opened from the modular case according to the present invention.

The upper and lower covers 24, 26 are fabricated from non-metallic light material that facilitates convenient holding and handling by the operator. Rotationally displacement of the entire handle 20 around the shaft pin 27 as axis displaces the hook 252 from the position fixing hole 13. FIG. 6 shows the entire handle 20 rotated through a certain angle in a clockwise direction, and FIG. 7 shows the modular case 10 inserted and clamped within slots 32 of a host outer case 30, wherein the handles 20 are in a folded back and closed state. A protrusion 225 of a tail end of each of the handles 20 clasps and fixes position on an inner wall surface 3211 of a protruding portion 321 of the outer case 30. Referring to FIG. 8, which shows the handles 20 in an open state, as depicted in FIG. 6, wherein an inclined surface 227 of each of the handles 20 presses against and produces a slight frictional slide displacement on an outer wall surface 3212. At which time a displacement effect of the modular case 10 is achieved, that is, the inclined surfaces 227 pressing on the outer wall surfaces 3212 form points of force application, and the handles 20 form force applicator arms that enable the modular case 10 to be displaced a certain distance out of the slots 32. The operator only needs to rotate the handles 20 through a certain angle to effortlessly linearly guide the modular case 10 a certain distance out of the slots 32. This action is defined as the first stage whereby the operator initially withdraws the modular case 10 from the slots 32. The second stage involves the operator grasping the modular case 10 protruding from the slots 32 in conjunction with grasping the handles 20 to enable the modular case 10 to be firmly withdrawn from the slots 32 without the worry of the modular case 10 falling to the ground because of excessive force applied by the operator during the course of withdrawing it from the slots 32.

Furthermore, when the operator wants to assemble the modular case 10 into the slots 32, the first stage involves first inserting the tail portion of the modular case 10 into the slots 32. When more than two thirds of the modular case 10 has been inserted into the slots 32, and when each of the inclined surfaces 227 press against the respective outer wall surface 3212, the first stage is thus completed. The second stage involves the operator holding the handles 20 and rotating then in a reverse direction (see FIG. 8), thereby causing the protrusions 225 to press against the respective inner wall surfaces 3211 forming points of force application, and the handles 20 form force applicator arms that enable smooth completion of the second stage whereby the modular case 10 is accurately clamped within the slots 32 in a linear direction by effort saving means. Furthermore, each of the hooks 252 clasp onto the respective surface of the inner wall 131 of the position fixing hole 13, as depicted in FIG. 4.

Figure 9:
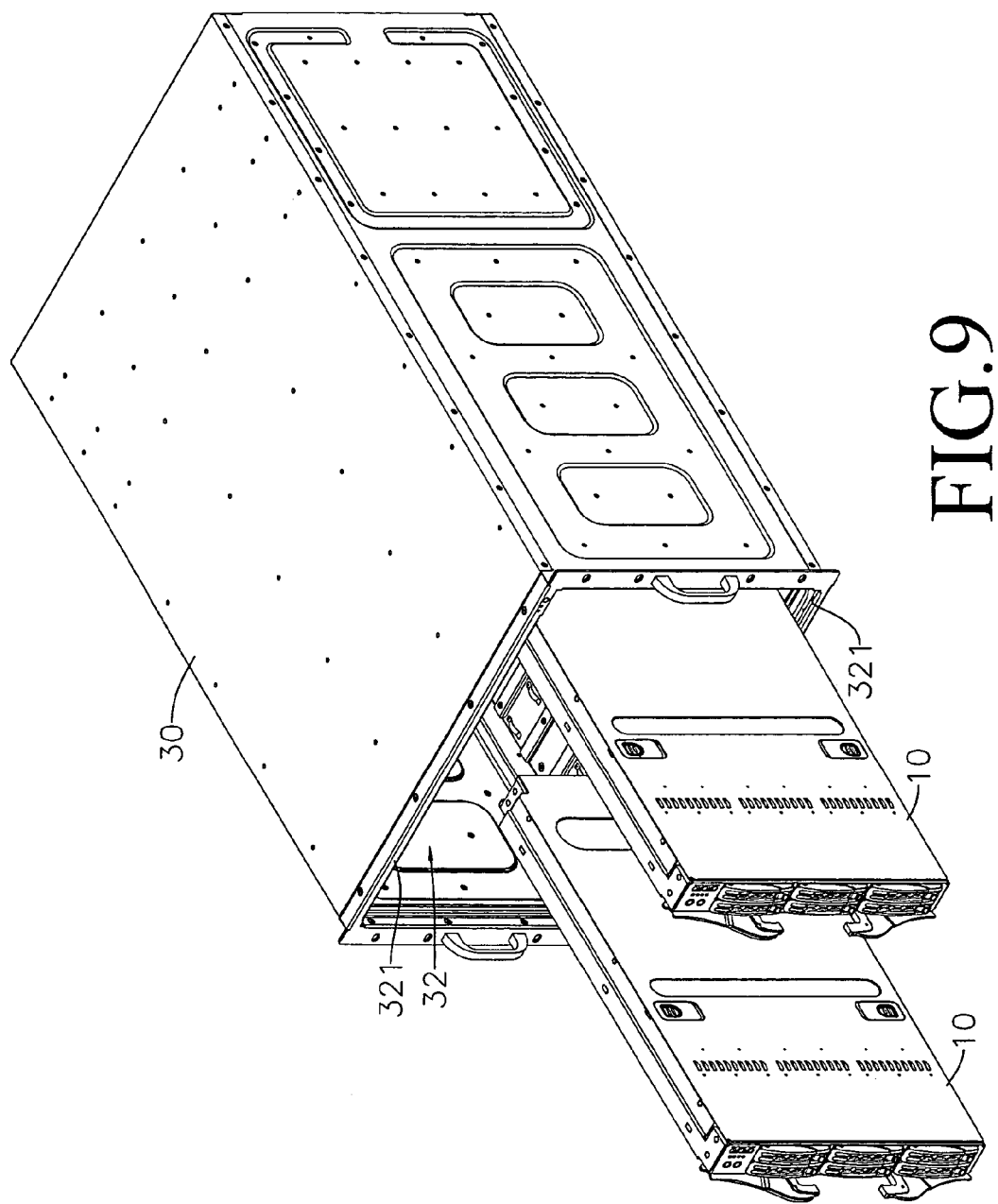
FIG. 9 shows an assembled elevational view depicting a plurality of the modular cases being assembled into the slots of the host outer case according to the present invention.

Referring to FIG. 9, which shows a plurality of the modular cases 10, (10) separately installed into the slots 32. The outer case 30 is an industrial computer host case, and the modular cases 10 are server cases that can be extracted from or disposed into the slots 32 according to the aforementioned procedural stages, which increases safety of withdrawing the modular cases 10 from the slots 32 and improves direction and accuracy of position fixing when inserting the modular cases 10 into the slots 32.

In conclusion, the present invention in overcoming structural shortcomings of prior art has assuredly achieved effectiveness of anticipated advancement, and practicability and advancement of the present invention clearly comply with essential elements as required for a new patent application. Accordingly, a new patent application is proposed herein.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A modular case handle positioning device comprising:
   a rectangular modular case having, undersides of a front surface of which are formed depressed indentations, each of the indentations have an inner groove surface, and position fixing holes are defined in a lower side of the front surface;
   at least more than one handle is movable connected to a lower surface of two sides of the modular case, each of the handles having a structure comprising:
   a platelike main body, wherein an upper cover is affixed to an upper surface of a front plate, and a lower cover is affixed to a lower surface, moreover, a front pivot joint hole is defined in the front plate, and a rear pivot joint hole is defined in a rear side of the main body; a side edge of the front plate forms an L-shaped side;
   an L-shaped linkage having two planar sides of which form a holding slot, a hook joining at an end of the planar sides, and a through hole is defined at a corner of the L-shaped linkage; and
   a first shaft pin is inserted into the through hole and the front pivot joint hole of the main body; the L-shaped linkage is able to angular swing on the front plate around the shaft pin as axis;
   a second shaft pin passes through the rear pivot joint hole and into the inner groove surface of the indentation;

wherein angular displacement of the handle is made around the first shaft pin as axis, and the hook clasps onto or separates from the position fixing hole.

2. The modular case handle positioning device according to claim 1, wherein sides of the upper cover and the lower cover form L-shaped sides, which correspond to the L-shaped linkage, and an L-shaped clearance is formed between the L-shaped sides and the L-shaped linkage.

3. The modular case handle positioning device according to claim 1, wherein an inner wall of the position fixing hole enables the hooks to clamp thereon.

4. The modular case handle positioning device according to claim 1, wherein the rectangular modular case inserts into slots defined in an outer case, protruding portions are formed on slot ends of the slots on two sides, a protrusion is formed at a rear end of the main body of each of the handles, an indentation is formed on a side of the protrusion, and an inclined surface is formed on a side of the indentation; the protrusion clasps onto or separates from an inner wall surface of the protruding portion, and the inclined surface clasps onto or separates from an outer wall surface of the respective protruding portions.

* * * * *